(12) United States Patent
Kameda et al.

(10) Patent No.: US 7,945,826 B2
(45) Date of Patent: May 17, 2011

(54) TEST APPARATUS AND TEST METHOD

(75) Inventors: Satoshi Kameda, Saitama (JP); Masaru Doi, Saitama (JP); Shinya Sato, Saitama (JP)

(73) Assignee: Advantest Corporation, Tokyo (JP)

( * ) Notice: Subject to any disclaimer, the term of this patent is extended or adjusted under 35 U.S.C. 154(b) by 174 days.

(21) Appl. No.: 12/487,615

(22) Filed: Jun. 18, 2009

(65) Prior Publication Data
US 2009/0327822 A1 Dec. 31, 2009

Related U.S. Application Data

(63) Continuation of application No. PCT/JP2007/073601, filed on Dec. 6, 2007.

(30) Foreign Application Priority Data

Dec. 26, 2006 (JP) .................................. 2006-350625

(51) Int. Cl.
*G11C 29/00* (2006.01)
(52) U.S. Cl. ........................................ 714/723; 714/719
(58) Field of Classification Search .................. 711/103, 711/2; 702/118; 714/733, 718, 723, 719
See application file for complete search history.

(56) References Cited

U.S. PATENT DOCUMENTS

| | | | | | |
|---|---|---|---|---|---|
| 5,369,754 | A | * | 11/1994 | Fandrich et al. | 711/103 |
| 5,835,927 | A | * | 11/1998 | Fandrich et al. | 711/2 |
| 5,956,473 | A | * | 9/1999 | Ma et al. | 714/5 |
| 6,085,334 | A | * | 7/2000 | Giles et al. | 714/7 |
| 6,535,986 | B1 | | 3/2003 | Rosno et al. | |
| 7,512,508 | B2 | * | 3/2009 | Rajski et al. | 702/118 |
| 2002/0051385 | A1 | | 5/2002 | Hosono et al. | |
| 2003/0204795 | A1 | | 10/2003 | Adams et al. | |

FOREIGN PATENT DOCUMENTS

JP    08-315597 A    11/1996
(Continued)

OTHER PUBLICATIONS

International Search Report (ISR), ISA220, and ISA237 for PCT/JP2007/073601 (the parent application), citing US Patent No. 1, US Patent Application Publications Nos. 1-2, and Foreign Patent Documents Nos. 2-9 indicated above, Dated: Jan. 15, 2008.

*Primary Examiner* — David Ton
(74) *Attorney, Agent, or Firm* — Chen Yoshimura LLP

(57) ABSTRACT

Provided is a test apparatus having a bad block memory for storing a plurality of pieces of fail information in association with blocks of a memory under test, each piece of fail information indicating whether there is a defect in the associated block. The test apparatus writes a test data sequence to a page under test of the memory under test, reads the test data sequence written to the page under test, and compares the read data sequence to the written data sequence. The test apparatus includes an allocation register that stores allocation information for setting which of the plurality of fail conditions for judging whether there is a defect in the page under test are allocated to the plurality of pieces of fail information. The test apparatus detects whether there is a defect corresponding to each of a plurality of fail conditions, outputs the detection result as a fail signal, and updates a plurality of pieces of fail information associated with the block including the page under test using the fail signal corresponding to the allocated fail conditions.

11 Claims, 11 Drawing Sheets

FOREIGN PATENT DOCUMENTS

| | | |
|---|---|---|
| JP | 10-312340 A | 11/1998 |
| JP | 2001-319493 A | 11/2001 |
| JP | 2002-140899 A | 5/2002 |
| JP | 2003-178600 A | 6/2003 |
| JP | 3490403 B2 | 1/2004 |
| JP | 2004-220068 A | 8/2004 |
| JP | 2006-139892 A | 6/2006 |
| JP | 3842238 B2 | 11/2006 |

* cited by examiner

| BLOCK NUMBER | COLUMN NUMBER / PAGE NUMBER | NUMBER OF FAIL BITS PER COLUMN | | | | | | | | | | | | | | | | BBM | MASK INFORMATION |
|---|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 ... | | |
| 0 | 0 | 0 | 0 | 0 | 0 | 0 | 0 | 0 | 0 | 0 | 0 | 0 | 0 | 0 | 0 | 0 | ... | 1 | 1 |
| | 1 | 0 | 0 | 0 | 0 | 0 | 0 | 0 | 0 | 0 | 0 | 0 | 0 | 0 | 0 | 0 | ... | | |
| | 2 | 0 | 0 | 1 | 0 | 0 | 0 | 2 | 0 | 0 | 1 | 0 | 1 | 0 | 0 | 0 | ... | | |
| | 3 | 0 | 0 | 0 | 0 | 0 | 0 | 0 | 0 | 0 | 0 | 0 | 0 | 0 | 0 | 0 | ... | | |
| | 4 | 0 | 0 | 0 | 0 | 0 | 0 | 0 | 0 | 0 | 0 | 0 | 0 | 0 | 0 | 0 | ... | | |
| | 5 | 0 | 0 | 0 | 0 | 0 | 0 | 0 | 0 | 0 | 0 | 0 | 0 | 0 | 0 | 0 | ... | | |
| | 6 | 0 | 0 | 0 | 0 | 0 | 1 | 0 | 0 | 1 | 0 | 1 | 0 | 0 | 1 | 0 | ... | | |
| | 7 | 0 | 0 | 0 | 0 | 0 | 0 | 0 | 0 | 0 | 0 | 0 | 0 | 0 | 0 | 0 | ... | | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ... | | |
| 1 | 0 | 0 | 0 | 0 | 0 | 0 | 0 | 0 | 0 | 0 | 0 | 0 | 0 | 0 | 0 | 0 | ... | 1 | 1 |
| | 1 | 0 | 0 | 0 | 0 | 0 | 0 | 0 | 0 | 0 | 0 | 0 | 0 | 0 | 0 | 0 | ... | | |
| | 2 | 0 | 0 | 0 | 0 | 0 | 0 | 0 | 0 | 0 | 0 | 0 | 0 | 0 | 0 | 0 | ... | | |
| | 3 | 0 | 0 | 0 | 1 | 0 | 0 | 0 | 1 | 0 | 0 | 1 | 0 | 0 | 0 | 0 | ... | | |
| | 4 | 0 | 0 | 0 | 0 | 0 | 0 | 0 | 0 | 0 | 0 | 0 | 0 | 0 | 0 | 0 | ... | | |
| | 5 | 0 | 0 | 0 | 0 | 0 | 0 | 0 | 0 | 0 | 0 | 0 | 0 | 0 | 0 | 0 | ... | | |
| | 6 | 0 | 1 | 0 | 0 | 0 | 1 | 0 | 0 | 0 | 1 | 0 | 0 | 1 | 0 | 1 | ... | | |
| | 7 | 0 | 0 | 0 | 0 | 0 | 0 | 0 | 0 | 0 | 0 | 0 | 0 | 0 | 0 | 0 | ... | | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ... | | |
| 2 | 0 | 0 | 0 | 0 | 0 | 0 | 0 | 0 | 0 | 0 | 0 | 0 | 0 | 0 | 0 | 0 | ... | 1 | 1 |
| | 1 | 0 | 0 | 0 | 0 | 0 | 0 | 0 | 0 | 0 | 0 | 0 | 0 | 0 | 0 | 0 | ... | | |
| | 2 | 0 | 0 | 0 | 0 | 0 | 0 | 0 | 0 | 0 | 0 | 0 | 0 | 0 | 0 | 0 | ... | | |
| | 3 | 0 | 8 | 0 | 0 | 0 | 0 | 0 | 0 | 0 | 0 | 0 | 0 | 0 | 0 | 0 | ... | | |
| | 4 | 0 | 0 | 0 | 0 | 0 | 0 | 0 | 0 | 0 | 0 | 0 | 0 | 0 | 0 | 0 | ... | | |
| | 5 | 0 | 0 | 0 | 0 | 0 | 0 | 0 | 0 | 0 | 0 | 0 | 0 | 0 | 0 | 0 | ... | | |
| | 6 | 0 | 0 | 0 | 0 | 0 | 0 | 0 | 0 | 0 | 0 | 0 | 0 | 0 | 0 | 0 | ... | | |
| | 7 | 0 | 0 | 0 | 0 | 0 | 0 | 0 | 0 | 0 | 0 | 0 | 0 | 0 | 0 | 0 | ... | | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ... | | |
| 3 | 0 | 0 | 0 | 0 | 0 | 0 | 0 | 0 | 0 | 0 | 0 | 0 | 0 | 0 | 0 | 0 | ... | 1 | 1 |
| | 1 | 0 | 0 | 0 | 0 | 0 | 0 | 0 | 0 | 0 | 0 | 0 | 0 | 0 | 0 | 0 | ... | | |
| | 2 | 0 | 0 | 0 | 0 | 0 | 1 | 0 | 0 | 0 | 0 | 0 | 0 | 0 | 0 | 0 | ... | | |
| | 3 | 0 | 0 | 0 | 0 | 0 | 0 | 0 | 0 | 0 | 0 | 1 | 0 | 0 | 1 | 0 | ... | | |
| | 4 | 0 | 0 | 3 | 0 | 0 | 0 | 0 | 0 | 0 | 0 | 0 | 0 | 0 | 0 | 0 | ... | | |
| | 5 | 0 | 0 | 0 | 0 | 0 | 0 | 0 | 0 | 0 | 0 | 0 | 0 | 0 | 0 | 0 | ... | | |
| | 6 | 0 | 0 | 0 | 0 | 0 | 0 | 0 | 0 | 0 | 0 | 0 | 0 | 0 | 0 | 0 | ... | | |
| | 7 | 0 | 0 | 0 | 0 | 0 | 0 | 0 | 0 | 0 | 0 | 0 | 0 | 0 | 4 | 0 | ... | | |
| | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ⋮ | ... | | |
| 4 | | | | | | | | | | | | | | | | | | 0 | 0 |
| ⋮ | ⋮ | | | | | | | | | | | | | | | | | ⋮ | ⋮ |

FIG. 4

| BLOCK NUMBER | COLUMN NUMBER / PAGE NUMBER | NUMBER OF FAIL BITS PER COLUMN | | | | | | | | | | | | | | | | BIT ECC | | | | | BYTE ECC | | | | |
|---|---|---|---|---|---|---|---|---|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 ··· | NUMBER OF FAIL BITS | 1 | 2 | 3 | 4 | NUMBER OF FAIL BYTES | 1 | 2 | 3 | 4 |
| 0 | 0 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 1 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 2 | 0 | 0 | 1 | 0 | 0 | 0 | 2 | 0 | 0 | 1 | 0 | 1 | 0 | 0 | 0 | 0 ··· | 5 | F | F | F | F | 4 | F | F | F | P |
| | 3 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 4 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 5 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 6 | 0 | 0 | 0 | 0 | 0 | 1 | 0 | 0 | 0 | 1 | 0 | 1 | 0 | 0 | 1 | 0 ··· | 4 | F | F | F | P | 4 | F | F | F | P |
| | 7 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | ⋮ | ⋮ | | | | | | | | | | | | | | | ··· | ⋮ | | | | | ⋮ | | | | |
| 1 | 0 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 1 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 2 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 3 | 0 | 0 | 0 | 1 | 0 | 0 | 0 | 1 | 0 | 0 | 1 | 0 | 0 | 0 | 0 | 0 ··· | 3 | F | F | P | P | 3 | F | F | P | P |
| | 4 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 5 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 6 | 0 | 1 | 0 | 0 | 0 | 1 | 0 | 0 | 0 | 1 | 0 | 0 | 1 | 0 | 1 | 0 ··· | 5 | F | F | F | F | 5 | F | F | F | F |
| | 7 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | ⋮ | | | | | | | | | | | | | | | | ··· | ⋮ | | | | | ⋮ | | | | |
| 2 | 0 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 1 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 2 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 3 | 0 | 8 | 0 | 0 | 0 | 0 | 0 | 0 | 0 | 0 | 0 | 0 | 0 | 0 | 0 | 0 ··· | 8 | F | F | F | F | 1 | P | P | P | P |
| | 4 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 5 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 6 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 7 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | ⋮ | | | | | | | | | | | | | | | | ··· | ⋮ | | | | | ⋮ | | | | |
| 3 | 0 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 1 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 2 | 0 | 0 | 0 | 0 | 1 | 0 | 0 | 0 | 0 | 0 | 0 | 0 | 0 | 0 | 0 | 0 ··· | 1 | P | P | P | P | 1 | P | P | P | P |
| | 3 | 0 | 0 | 0 | 0 | 0 | 0 | 0 | 0 | 0 | 0 | 1 | 0 | 0 | 1 | 0 | 0 ··· | 2 | F | P | P | P | 2 | F | P | P | P |
| | 4 | 0 | 0 | 3 | 0 | 0 | 0 | 0 | 0 | 0 | 0 | 0 | 0 | 0 | 0 | 0 | 0 ··· | 3 | F | F | P | P | 3 | P | P | P | P |
| | 5 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 6 | 0 | 0 | 0 | 0 | 0 | 0 | 0 | 0 | 0 | 0 | 0 | 0 | 0 | 0 | 0 | 0 ··· | 0 | P | P | P | P | 0 | P | P | P | P |
| | 7 | 0 | 0 | 0 | 0 | 0 | 0 | 0 | 0 | 0 | 0 | 0 | 0 | 0 | 4 | 0 | 0 ··· | 4 | F | F | F | P | 1 | P | P | P | P |
| | ⋮ | | | | | | | | | | | | | | | | ··· | ⋮ | | | | | ⋮ | | | | |

*FIG. 6*

| BLOCK NUMBER | COLUMN NUMBER / PAGE NUMBER | PROGRAM TIME | JUDGMENT RESULT | ERASE TIME | JUDGMENT RESULT |
|---|---|---|---|---|---|
| 0 | 0 | 200 μs | P | 15ms | F |
|   | 1 | 200 μs | P |   |   |
|   | 2 | 200 μs | P |   |   |
|   | 3 | 200 μs | P |   |   |
|   | 4 | 200 μs | P |   |   |
|   | 5 | 200 μs | P |   |   |
|   | 6 | 200 μs | P |   |   |
|   | 7 | 200 μs | P |   |   |
|   | ⋮ | ⋮ | ⋮ |   |   |
| 1 | 0 | 200 μs | P | 2ms | P |
|   | 1 | 200 μs | P |   |   |
|   | 2 | 200 μs | P |   |   |
|   | 3 | 200 μs | P |   |   |
|   | 4 | 200 μs | P |   |   |
|   | 5 | 200 μs | P |   |   |
|   | 6 | 200 μs | P |   |   |
|   | 7 | 200 μs | P |   |   |
|   | ⋮ | ⋮ | ⋮ |   |   |
| 2 | 0 | 200 μs | P | 2ms | P |
|   | 1 | 200 μs | P |   |   |
|   | 2 | 200 μs | P |   |   |
|   | 3 | 200 μs | P |   |   |
|   | 4 | 200 μs | P |   |   |
|   | 5 | 200 μs | P |   |   |
|   | 6 | 200 μs | P |   |   |
|   | 7 | 1500 μs | F |   |   |
|   | ⋮ | ⋮ | ⋮ |   |   |
| 3 | 0 | 200 μs | P | 2ms | P |
|   | 1 | 200 μs | P |   |   |
|   | 2 | 200 μs | P |   |   |
|   | 3 | 200 μs | P |   |   |
|   | 4 | 200 μs | P |   |   |
|   | 5 | 200 μs | P |   |   |
|   | 6 | 200 μs | P |   |   |
|   | 7 | 200 μs | P |   |   |
|   | ⋮ | ⋮ | ⋮ |   |   |
| ⋮ | ⋮ | ⋮ | ⋮ | ⋮ | ⋮ |

*FIG. 7*

| BLOCK NUMBER | FLAG / PAGE NUMBER | BBM | | | DMASK |
|---|---|---|---|---|---|
| | | Bit0 | Bit1 | Bit2 | |
| 0 | 0<br>1<br>2<br>3<br>4<br>5<br>6<br>7<br>⋮ | 1 | 1 | 0 | 1 |
| 1 | 0<br>1<br>2<br>3<br>4<br>5<br>6<br>7<br>⋮ | 1 | 1 | 0 | 1 |
| 2 | 0<br>1<br>2<br>3<br>4<br>5<br>6<br>7<br>⋮ | 1 | 0 | 1 | 1 |
| 3 | 0<br>1<br>2<br>3<br>4<br>5<br>6<br>7<br>⋮ | 1 | 0 | 0 | 0 |
| ⋮ | ⋮ | ⋮ | ⋮ | ⋮ | ⋮ |

*FIG. 8*

TEST APPARATUS AND TEST METHOD

CROSS REFERENCE TO RELATED APPLICATION

This is a continuation application of PCT/JP2007/073601 filed on Dec. 6, 2007 which claims priority from a Japanese Patent Application No. 2006-350625 filed on Dec. 26, 2006, the contents of which are incorporated herein by reference.

BACKGROUND

1. Technical Field

The present invention relates to a test apparatus and a test method. In particular, the present invention relates to a test apparatus and a test method for detecting abnormalities in reading or writing of data from or to a memory under test.

2. Related Art

Recently, non-volatile memories such as a NAND flash memory have become widely used. The test apparatus for a memory device logically compares an output of the memory under test to an expected value, and judges the memory to be acceptable if the values match and to be defective if the values do not match. However, judging the memory to be defective merely because of a very slight discrepancy between the output and the expected value greatly decreases the yield of the memory device. Therefore, the memory device is provided in advance with backup storage regions that are used in place of storage regions in which a defect is detected. Furthermore, data can be corrected using error correction code (ECC) which allows for the presence of a small number of errors. In this way, even a memory device judged to be defective during testing may be acceptable if the detected errors are within an allowable range.

Such a test apparatus and test method for a memory device are shown in Japanese Patent Application Publication No. 2001-319493.

A conventional test apparatus manages errors in an acceptable memory device by detecting what types of errors occur in each block of the memory device. After detecting the types of errors, the test apparatus determines what following processes should be applied, such as a repair process that exchanges the defective blocks for backup blocks. However, there are many different types of errors, so storing all possible error types in the test apparatus greatly increases the necessary storage capacity for error storage, thereby increasing the scale of the test apparatus. Furthermore, all of the stored error information is not necessarily used in the following processes, and so the storage regions are not used efficiently.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus for testing a memory under test accessed in page-units and having a storage region that can be disabled in block-units that contain defects, each block including a plurality of pages, the test apparatus comprising: a bad block memory that stores a plurality of pieces of fail information in association with the blocks of the memory under test, each piece of fail information indicating whether there is a defect in the corresponding block; a data writing section that writes a test data sequence to a page under test of the memory under test; a data reading section that reads the test data sequence written to the page under test; a comparing section that compares the read data sequence to the written data sequence; a fail detecting section that detects whether there is a defect corresponding to each of a plurality of predetermined fail conditions serving as conditions for determining whether there is a defect in the page under test, and outputs the detection result as a fail signal; and an updating section that updates a plurality of pieces of fail information associated with the block including the page under test using the fail signal corresponding to fail conditions allocated in advance to the plurality of pieces of fail information associated with the block including the page under test.

According to a second aspect related to the innovations herein, one exemplary test apparatus may include a test apparatus for testing a memory under test accessed in page-units and having a storage region that can be disabled in block-units that contain defects, each block including a plurality of pages, the test apparatus comprising: a bad block memory that stores a plurality of pieces of fail information in association with the blocks of the memory under test, each piece of fail information indicating whether there is a defect in the corresponding block; a data writing section that writes a test data sequence to a page under test of the memory under test; a data reading section that reads the test data sequence written to the page under test; a comparing section that compares the read data sequence to the written data sequence; a fail detecting section that detects whether there is a defect corresponding to a plurality of fail conditions for determining whether there is a defect in the page under test, and outputs the detection results as fail signals; an updating section that updates a plurality of pieces of fail information associated with the block including the page under test using a plurality of the fail signals; a disable register that stores disable information designating, from among the plurality of pieces of fail information, pieces of fail information associated with a defect for which the block is to be disabled; and a mask processing section that reads, from the bad block memory, the plurality of pieces of fail information associated with the block including the page under test, and that cancels testing of the page under test if the pieces of fail information designated by the disable register from among the plurality of pieces of read fail information indicate that there is a defect in the block.

According to a third aspect related to the innovations herein, one exemplary test method may include a method for testing, with a test apparatus, a memory under test accessed in page-units and having a storage region that can be disabled in block-units that contain defects, each block including a plurality of pages, the method comprising: causing a bad block memory provided to the test apparatus to store a plurality of pieces of fail information in association with the blocks of the memory under test, each piece of fail information indicating whether there is a defect in the corresponding block; writing a test data sequence to a page under test of the memory under test; reading the test data sequence written to the page under test; comparing the read data sequence to the written data sequence; detecting whether there is a defect corresponding to each of a plurality of predetermined fail conditions serving as conditions for determining whether there is a defect in the page under test, and outputting the detection result as a fail signal; and updating a plurality of pieces of fail information associated with the block including the page under test using the fail signal corresponding to fail conditions allocated in advance to the plurality of pieces of fail information associated with the block including the page under test.

According to a fourth aspect related to the innovations herein, one exemplary test method may include a test apparatus that tests a memory under test, which is a flash memory including a plurality of blocks that each include a plurality of pages, the test apparatus comprising a fail detecting section that detects a defect in (i) reading or writing of page-units of data from or to the memory under test or (ii) a process for deleting a block-unit of data from the memory under test, and outputs the detection result as a fail signal; a control apparatus that divides the memory under test into a plurality of grades based on the fail signal output by the fail detecting section, wherein the fail detecting section includes a fail detector detecting at least one of (i) whether error correction is possible with any of a plurality of different types of error correction codes, (ii) whether or not a program time, which is a time needed from when the writing begins to complete the writing, is greater than or equal to a reference value and (iii) whether or not a time needed to delete a block-unit of data is greater than or equal to a reference value.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 4 shows a specific example of a bit error occurring in the memory under test 100 according to the present embodiment.

FIG. 6 shows a first example of fails detected by the memory under test 100 according to an embodiment of the present invention.

FIG. 7 shows a second example of fails detected by the memory under test 100 according to an embodiment of the present invention.

FIG. 8 shows exemplary mask signals generated based on detected fail information by the test apparatus 10 according to an embodiment of the present invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
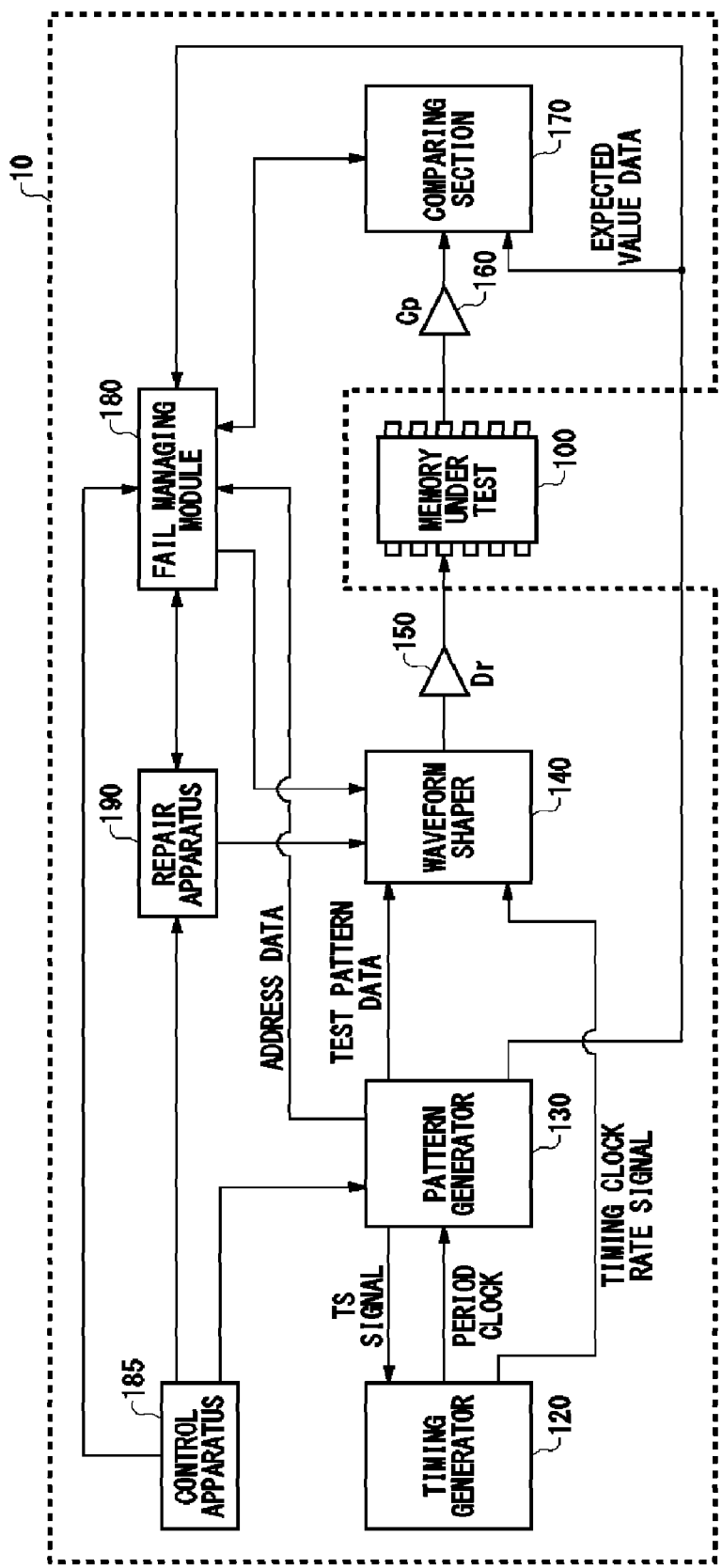
FIG. 1 shows an overall configuration of a test apparatus 10 according to an embodiment of the present invention.

FIG. 1 shows an overall configuration of a test apparatus 10 according to an embodiment of the present invention. The test apparatus 10 is provided with a timing generator 120, a pattern generator 130, a waveform shaper 140, a driver 150, a comparator 160, a comparing section 170, a fail managing module 180, a control apparatus 185, and a repair apparatus 190. The timing generator 120 uses timing data, which is designated by a timing set signal (TS signal) output from the pattern generator 130, to generate a period clock indicating one test cycle and a RATE signal indicating an initiation timing of a test cycle. The timing generator 120 supplies the pattern generator 130 with the period clock and supplies the waveform shaper 140 with the RATE signal and the timing clock.

The pattern generator 130 generates test pattern data to be supplied to the memory under test 100, based on the period clock, and supplies the test pattern data to the waveform shaper 140. This test pattern data includes (i) a test pattern that is made up of a signal to be supplied to the memory under test 100 to write a data sequence to the memory under test 100 and (ii) a test pattern made up of a signal to be supplied to the memory under test 100 to read the written data sequence from the memory under test 100. The waveform shaper 140 is an example of a data writing section in the present invention, and writes a test data sequence to a page being tested in the memory under test 100. When writing, the waveform shaper 140 shapes the data sequence into a timing waveform to be supplied to the memory under test 100, based on the timing clock and the RATE signal.

The driver 150 supplies the memory under test 100 with the test pattern data formed by the waveform shaper 140 as the test pattern signal. The comparator 160 is an example of a data reading section in the present invention, and reads the data sequence for testing that is written onto the page under test. More specifically, the comparator 160 compares the output signal output by the memory under test 100 in response to the test pattern to a predetermined reference voltage, and sequentially acquires a logic value of the output signal to form a data sequence. The comparing section 170 compares (i) each piece of data in the data sequence read from the memory under test 100 in response to the test pattern to (ii) an expected value generated in advance by the pattern generator 130. This expected value is the data sequence written by the waveform shaper 140 to the memory under test 100. The comparing section 170 may determine whether the time necessary to read the data sequence is within a range according to a predetermined standard.

The fail managing module 180 stores, in each block of the memory under test 100, the type of error occurring in the memory under test 100, based on the comparison result and the determination result from the comparing section 170. Memory that stores an error type is called "bad block memory." After testing is finished, the repair apparatus 190 performs a repair process so that the memory under test 100 becomes usable, based on the content stored in the bad block memory by the comparing section 170. This repair process may include a block repair process, a page repair process, a column repair process, or the like.

A block repair process involves setting each block in which a defect occurred as unusable, and setting backup blocks as usable. The page repair process involves setting the entirety of a page in which a defect is detected to be unusable, and setting a backup page to be usable. A "page" is a unit of memory smaller than a block. The column repair process involves setting the entirety of a column in which a defect is detected to be unusable, and setting a backup column to be usable. A "column" is a unit designating a storage cell.

The control apparatus 185 orders the initiation of the test processes and repair processes described above for each component. For example, the control apparatus 185 sequentially orders the pattern generator 130 and the fail managing module 180 to perform several test processes and, after the test processes are completed, orders the repair apparatus 190 to perform a repair process. The control apparatus 185 may divide the memory under test 100 into a plurality of grades based on fail information stored in a bad block memory 500, described further below. For example, the control apparatus 185 may divide the memory under test 100 into grades such as a memory under test 100 that can operate correctly if the ECC can correct a 1-bit error, and a memory under test 100 that can operate correctly if the ECC can correct a 4-bit error.

With the structure described above, it is an objective of the test apparatus 10 of the present embodiment to be capable of setting any error type to be recorded by the fail managing module 180 according to the objective and conditions of the test, thereby decreasing the necessary capacity of the storage device, e.g. the bad block memory, provided to the fail managing module 180, and enabling performance of a wide variety of test processes and repair processes.

Figure 2:
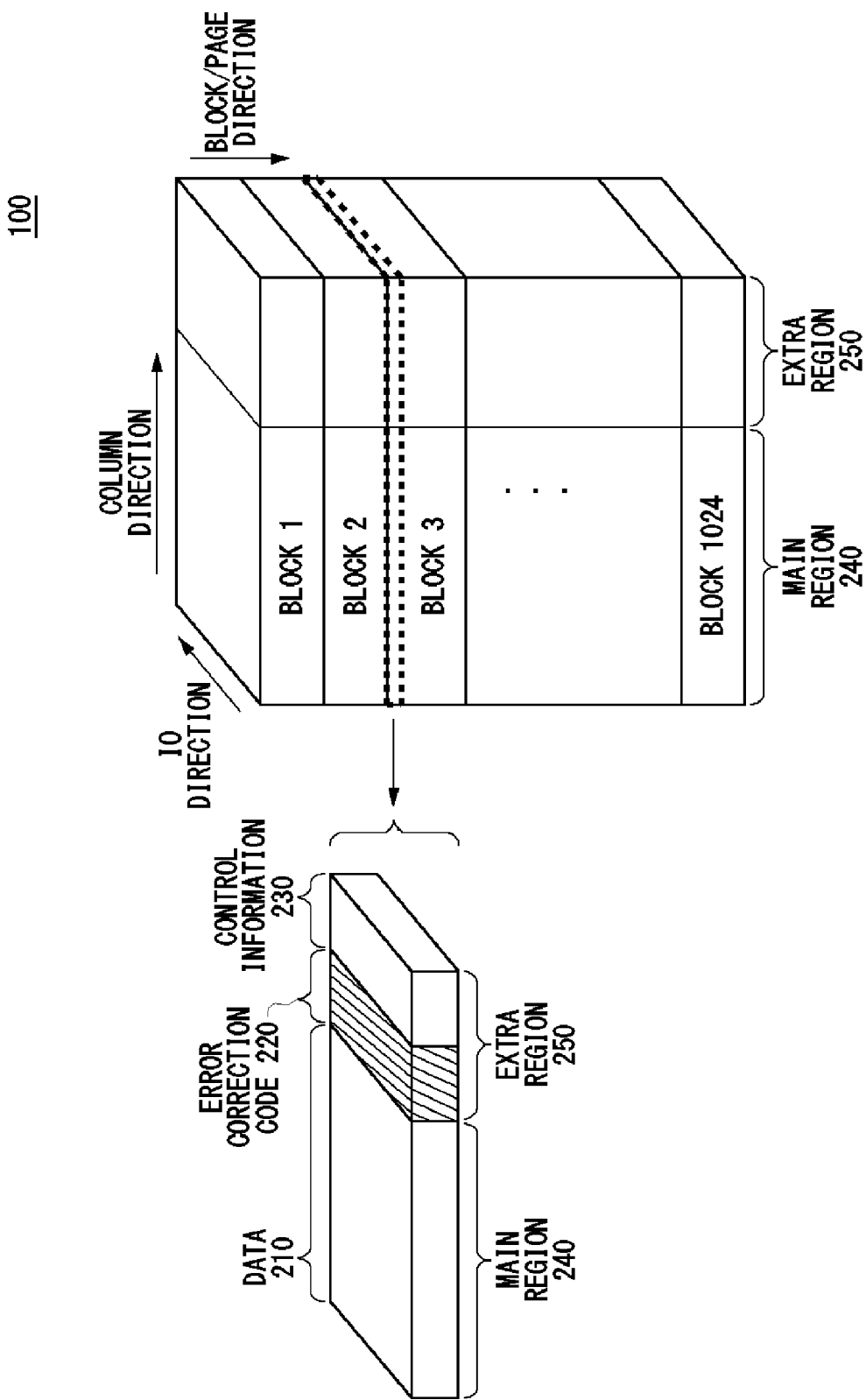
FIG. 2 shows a storage region of the memory under test 100 according to the present embodiment.

FIG. 2 shows a storage region of the memory under test 100 according to the present embodiment. The memory under test 100 of the present embodiment is a non-volatile storage device such as a flash memory, for example, and the storage region of the memory under test 100 is divided into a plurality of blocks. Each block has a data storage capacity of 64 KB, for example, and is made up of a plurality of pages, e.g. 32 pages in the present example. The memory under test 100 of the present embodiment has data sequences written thereto or read therefrom in page-units that each have a data storage capacity of 2 KB, for example. More specifically, the memory under test 100 includes a plurality of 8-bit data IO terminals, for example, and transfers one word, i.e. 8 bits, of data in each input/output cycle via the data IO terminals. In a single reading or writing process, the reading or writing is performed in page-units by sequentially transferring each word in the page in the order of the columns.

The storage region in the memory under test 100 includes a main region 240 and an extra region 250. The main region 240 stores data 210 to be stored by the memory under test 100. The extra region 250 stores error correction code 220 for correcting bit errors in the data 210, and control information 230 indicating that use of a page is prohibited. If the extra region 250 stores a specified value as the control information 230, the entirety of each block including this control information 230 is set to be unusable, and the entirety of each page including this control information 230 is set to be unusable. What type of setting is made according to what type of written value and what type of settings are possible depends on the specification of the memory under test 100.

Figure 3:
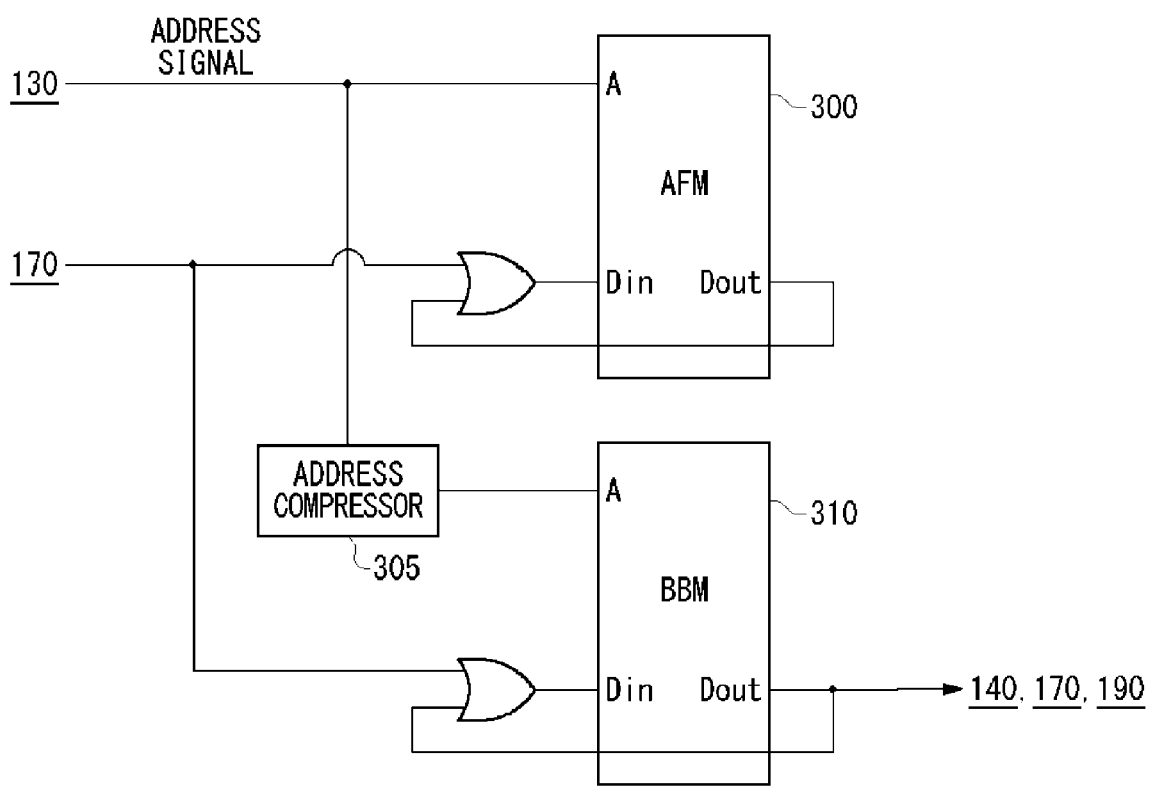
FIG. 3 shows an exemplary configuration of the fail managing module 180 according to the present embodiment.

FIG. 3 shows an exemplary configuration of the fail managing module 180 according to the present embodiment. If a judgment is made for each block concerning simply whether the block is defective, the configuration of the fail managing module 180 can be the configuration shown in FIG. 3. More specifically, the fail managing module 180 includes an address fail memory 300, an address compressor 305, and a bad block memory 310. The address fail memory 300 stores bit pass/fail information indicating, for each storage cell of the memory under test 100, whether the storage cell is defective, based on the comparison result from the comparing section 170. More specifically, the address fail memory 300 stores an acceptability judgment result input from the comparing section 170 at an address input from the waveform shaper 140. As a result of sequentially testing each storage cell, the data configured as a bit map indicating the acceptability of each storage cell is stored in the address fail memory 300.

The address compressor 305 generates identification information of the block associated with the address input from the pattern generator 130, and supplies the identification information to the bad block memory 310. More specifically, the address compressor 305 may generate the block identification information by masking and eliminating a portion of the bits in the input address. The bad block memory 310 stores a plurality of pieces of fail information, each piece of fail information stored in association with a block of the memory under test 100 and indicating whether there is a defect in that block. More specifically, the bad block memory 310 receives the identification information of blocks to be tested from the address compressor 305 and the acceptability judgment result for each block from the comparing section 170. The bad block memory 310 then stores each acceptability judgment result at the corresponding address designated by the received identification information.

The stored acceptability judgment results may be output to the waveform shaper 140 and the comparing section 170 as mask information so that the same block is not tested again. Upon receiving this mask information, the waveform shaper 140 stops outputting the test data sequence and the comparing section 170 stops comparing the output data sequence. The mask information may also be output to the repair apparatus 190. In this way, the repair apparatus 190 can efficiently execute the repair function after testing.

FIG. 4 shows a specific example of bit errors occurring in the memory under test 100 according to the present embodiment. Page 2 in Block 0 contains storage cells having an error at columns 2, 6, 9, and 11. The values in the chart indicate the number of storage cells having an error. Page 3 of Block 1 contains storage cells having an error at columns 3, 7, and 10. In this way, when even one storage cell with an error is found in a block, the fail managing module 180 stores information indicating that this block is defective in the bad block memory 310. In the present example, blocks 0 to 3 all contain storage cells with defects, and so the bad block memory 310 stores a logic value of 1, which indicates a defect, in association with each of these blocks. The bad block memory 310 may output the logic value indicating a defect as the mask information. In other words, the mask information output for each of the blocks 0 to 3 has a logic value of 1.

If only the result of the defect judgment is stored, the fail managing module 180 having the configuration shown in FIG. 3 may be used. However, depending on the specifications of the memory under test 100, it may be desirable to also store information that can identify the type of error occurring in each block to allow for various later processes such as the repair processes. The following describes a configuration that can decrease the necessary storage capacity while allowing storage of the error type occurring in each block.

Figure 5:
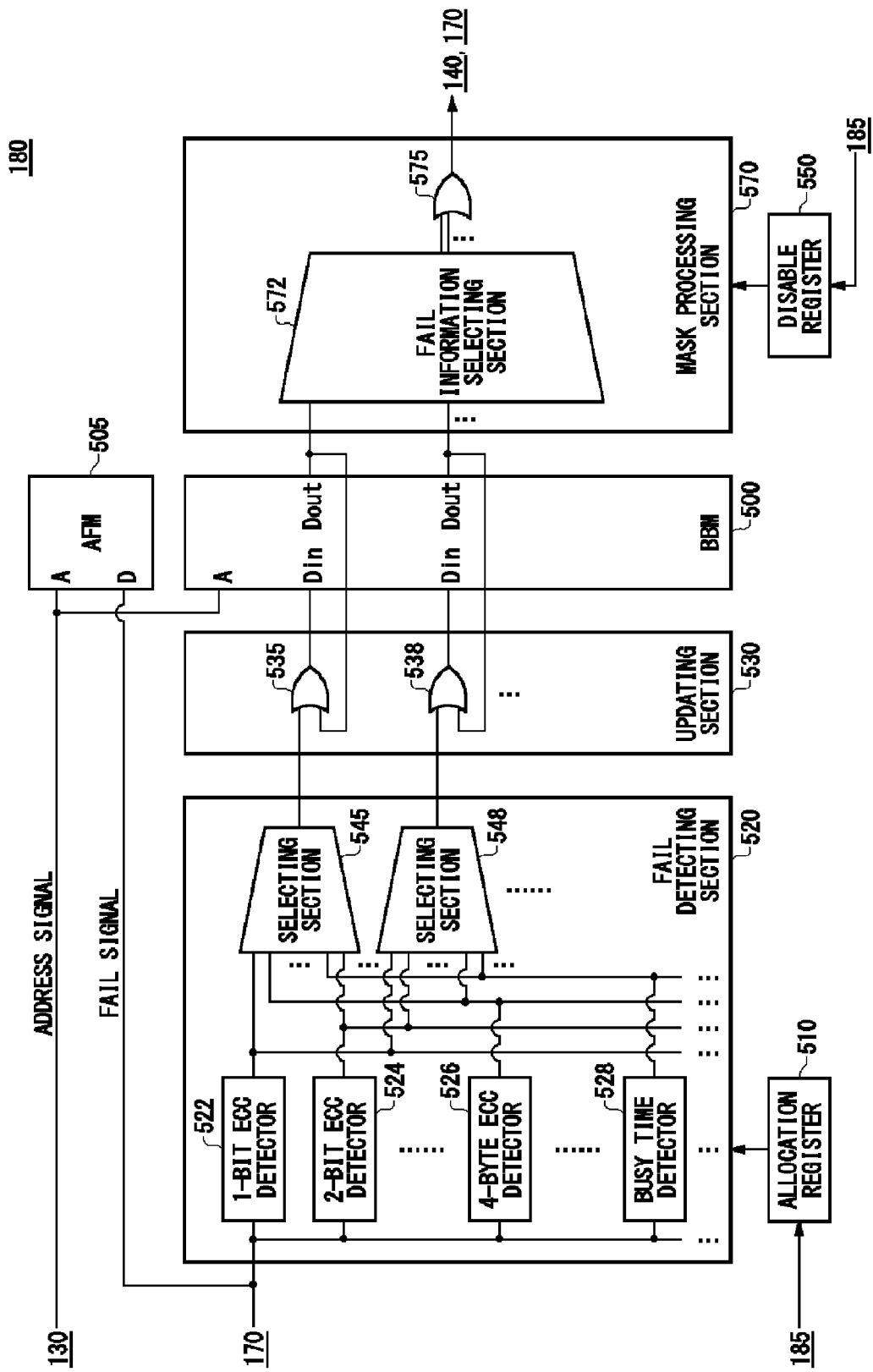
FIG. 5 shows a detailed configuration of the fail managing module 180 according to an embodiment of the present invention.

FIG. 5 shows a detailed configuration of the fail managing module 180 according to an embodiment of the present invention. The fail managing module 180 includes a bad block memory 500, an address fail memory 505, an allocation register 510, a fail detecting section 520, an updating section 530, a disable register 550, and a mask processing section 570. The bad block memory 500 stores a plurality of pieces of fail information, each piece of fail information stored in association with a block of the memory under test 100 and indicating whether there is a defect in that block. The pieces of fail information indicate the presence of different types of errors. The address fail memory 505 stores bit pass/fail information indicating whether each storage cell of the memory under test 100 is defective based on the comparison results of the comparing section 170. More specifically, the address fail memory 505 stores an acceptability judgment result received from the comparing section 170 at an address received from the pattern generator 130.

The allocation register 510 allocation information that sets, for each piece of fail information, a plurality of fail conditions for judging whether a defect is present in the page under test. For example, according to this setting, a certain piece of fail information may be allocated a fail condition corresponding to whether error correction is possible using an ECC that can correct a 1-bit error, and another piece of fail information may be allocated a fail condition corresponding to whether the time necessary to read the data is longer than a prescribed time. This allocation information may be set by the control apparatus 185 depending on the type of testing and the objective of the testing.

The fail detecting section 520 detects whether defects corresponding to the plurality of fail conditions are present, and outputs the detection results to the updating section 530 as fail signals. For example, the fail detecting section 520 detects a defect in the reading or writing of a page-unit of data from or to the memory under test 100, or a defect in a process for deleting a page-unit of data from the memory under test 100. As a specific configurational example, the fail detecting section 520 may include a 1-bit ECC detector 522, a 2-bit ECC detector 524, a 4-byte ECC detector 526, a busy time detector 528, a selecting section 545, and a selecting section 548. The 1-bit ECC detector 522, the 2-bit ECC detector 524, the 4-byte ECC detector 526, and the busy time detector 528 are each an example of a fail detector in the present invention. These fail detectors detect different defects in a page under test based on at least one of a comparison result from the comparing section 170, time necessary to write a data sequence, and time necessary to read a data sequence.

More specifically, the 1-bit ECC detector 522 detects defects that cannot be corrected by an ECC that corrects a 1-bit error. The 2-bit ECC detector 524 detects defects that cannot be corrected by an ECC that corrects a 2-bit error. These ECCs are both provided to each page, and can correct errors on a condition that the number of bit errors in one page is no greater than a prescribed number. In this way, the errors detected by the plurality of fail detectors may be of the same type but different degrees. The 4-byte ECC detector 526 detects defects that cannot be corrected by an ECC that corrects a 4-byte error. This ECC can correct an error on a condition that the number of columns in which a bit error is present in a single page is no greater than a prescribed number. The busy time detector 528 detects whether the waiting time from when a command, such as reading or writing, is issued to when the result is output falls outside of prescribed specifications. In this way, each fail detector detects a different type of error.

The selecting section 545, the selecting section 548, and other selecting sections are each provided to correspond to one of the pieces of fail information, and each select the fail detector to which the corresponding fail information is allocated by the allocation register 510. For example, the selecting section 545 may select the 1-bit ECC detector 522 and the 2-bit ECC detector 524 based on the allocation register 510, and the selecting section 548 may select the 1-bit ECC detector 522 and the busy time detector 528 based on the allocation register 510, such that each selecting section selects a different combination of fail detectors. The selecting section 545, the selecting section 548, and the other selecting sections each output, to the updating section 530, a fail signal generated based on the detection results of the selected fail detectors. The fail signal may be the logical sum of the output of the plurality of selected fail detectors, for example. In other words, when one of the selected fail detectors detects an error, a logic value indicating a fail occurrence is output in the fail signal.

The updating section 530 updates the plurality of pieces of fail information associated with the block containing the page under test, using the fail signal corresponding to the allocated fail conditions. More specifically, the updating section 530 includes a plurality of OR gates, represented here by OR gates 535 and 538, corresponding one-to-one with the selecting sections. Each OR gate writes, to the bad block memory 500, the fail signal received from the fail detecting section 520 and the logical sum output from the corresponding bits of the bad block memory 500. In other words, when a certain fail condition is fulfilled for a certain block, a logic value indicating fulfillment of the fail condition is written to the region in the bad block memory 500 corresponding to this block, and this value is continuously overwritten until testing of the block is completed. In this way, the test apparatus 10 can judge whether a defect has occurred in the block after testing is completed.

The following describes a process of controlling later testing of a block based on fail information stored in association with the block. The disable register 550 stores, among the pieces of fail information, disable information that designates fail information associated with a defect that causes the block to be disabled.

The mask processing section 570 reads. From the bad block memory 500, the plurality of pieces of fail information associated with the block containing a page under test. If a piece of fail information designated by the disable register 550, from among the read pieces of fail information, indicates a defect in the block, the mask processing section 570 does not test the page under test. As an example of a specific configuration, the mask processing section 570 may include a fail information selecting section 572 and a mask generating section 575. The fail information selecting section 572 selects the fail information designated by the disable register 550 from among the plurality of pieces of read fail information. For example, a minor error in a block is not a sufficient reason for not performing further testing of the block, and so fail information indicating such a minor error is not selected by the fail information selecting section 572. On the other had, fail information indicating a relatively major error is selected by the fail information selecting section 572.

The mask generating section 575 generates a mask signal indicating whether a test will be performed on a target page, based on the selected fail information. The generated mask signal is supplied to the waveform shaper 140 and the comparing section 170. When the mask signal is received, the waveform shaper 140 does not write the test data sequence to the target page. When the comparing section 170 receives the mask signal, the comparing section 170 does not detect a discrepancy between the data sequence read from the page and the data sequence written to the page. As a result, further testing is cancelled for a block in which a relatively major error occurs, which prevents longer testing time caused by further errors occurring during further testing.

FIG. 6 shows a first example of fails detected by the memory under test 100 according to an embodiment of the present invention. This example shows the number of bits exhibiting a bit error in each block, page, and column. For example, in block 0, page 2, column 2, there is one bit error.

In column six of the same page there are two bit errors, in column 9 of the same page there is one bit error, and in column 11 of the same page there is one bit error.

A total of five bit errors occur in page 2. This error cannot be corrected by a 1-bit ECC, a 2-bit ECC, a 3-bit ECC, or a 4-bit ECC. In this case, the 1-bit ECC detector 522 detects an error that exceeds what can be corrected by a 1-bit ECC, and therefore outputs fail information. The output of this fail information is represented by the letter F ("F" standing for "Fail") in the 1-bit ECC column in FIG. 6. In the same way, the columns for the 2-bit to 4-bit ECCs also display the letter F in their respective columns.

Furthermore, in page 2, the total number of columns, which are the same as "bytes" in the present diagram, containing a bit error is 4. This error cannot be corrected by the 1-byte to 3-byte ECCs, but can be corrected by the 4-byte ECC. Accordingly, fail information is not output by the busy time detector 528, which detects whether an error exceeds the correctable limit of the 4-byte ECC. FIG. 6 represents the busy time detector 528 not outputting the fail information by displaying the letter P ("P" standing for "Pass") in the 4-byte ECC column. The 1-byte to 3-byte ECCs display the letter F in their columns.

The same process is performed for the other blocks. For example, block 2, page 3, column 2 contains 8 bit errors, and therefore this error cannot be corrected by the 1-bit to 4-bit ECCs. Accordingly, an F is shown in each of the columns of the 1-bit to 4-bit ECCs for this page. On the other hand, no other bit errors occur in this page, and so the error can be corrected by the 1-byte ECC. As a result, fail information is not output by the busy time detector 528 and the fail detectors associated with other byte ECCs. Accordingly, a P is shown each of the columns of the 1-byte to 4-byte ECCs for this page.

FIG. 7 shows a second example of fails detected by the memory under test 100 according to an embodiment of the present invention. This example shows the time needed to write a page-unit of data to a page, i.e. the program time, for each page of each block. FIG. 7 also shows the time needed to delete a block-unit of data from a block, i.e. the erase time, for each block. For example, the program time for each page in block 0 is 200 μs, but the program time for page 7 of block 2 is 1500 μs. The erase time for block 0 is 15 ms, but the erase time for each of blocks 1 to 3 is 2 ms.

When the busy time detector 528 detects an abnormality in the program time, such as page 7 of block 0 requiring a program time of 1500 μs, which exceeds a predetermined reference value such as 600 μs, the busy time detector 528 outputs fail information for page 7, for example. This fail information is represented by the letter F in the column of FIG. 7 indicating the judgment result corresponding to page 7. As another example, when the busy time detector 528 detects an abnormality in the erase time, such as block 0 requiring an erase time of 15 ms, which exceeds a predetermined reference value, the busy time detector 528 outputs fail information for block 0. This fail information is represented by the letter F in the column of FIG. 7 indicating the judgment result corresponding to block 0.

In this way, by including a plurality of fail detectors, the fail detecting section 520 can detect not only the bit errors shown in FIG. 6, but also various other types of fails such as the time needed to write the data shown in FIG. 7.

The abnormal program time shown in FIG. 7 is not determined for each page, and may be determined based on a maximum value or an average value of the program time for each page in a block.

FIG. 8 shows exemplary mask signals generated based on detected fail information by the test apparatus 10 according to an embodiment of the present invention. Each of bits Bit0 to Bit2 of the bad block memory (BBM) represents a storage region for storing fail information. In other words, each of the bits Bit0 to Bit2 is associated with a block of the memory under test 100 and stores fail information indicating whether there is a defect in the associated block. The type of fails expressed by the fail information may be different from each other.

For example, Bit0 of BBM indicates fail information that is output by the 1-bit ECC detector 522, selected by the selecting section 545, and stored in the bad block memory 500. This fail information represents whether fail conditions expressed by a combination of the 1-bit ECC detector 522 and the selecting section 545 are met. This fail information may be a logical addition result of the detection results of a plurality of fail detectors, such as the 1-bit ECC detector 522 and the 2-bit ECC detector 524. It should be noted that, for ease of explanation, Bit0 represents the fail information output by the 1-bit ECC detector 522. A logic value of 1 indicates that fail information is stored, and a logic value of 0 indicates that fail information is not stored.

Bit2 of the BBM indicates fail information output from a fail detector that detects errors that cannot be corrected by a 2-byte ECC. Bit2 of the BBM represents fail information output from the busy time detector 528, which, in this case, indicates whether a page is detected for which the program time exceeds the reference value. Furthermore, DMASK represents mask information generated by the mask processing section 570 based on the corresponding pieces of fail information. The mask processing section 570 selects fail information from Bit1 and Bit2 for each block. The mask generating section 575 outputs the logical sum of these pieces of fail information for each block as the mask signal.

Accordingly, blocks 0 to 2, in which at least one of Bit1 and Bit2 has a logic value of 1, each have a mask signal with a logic value of 1. On the other hand, block 3, in which both Bit1 and Bit2 have a logic value of 0, has a mask signal with a logic value of 0.

In this way, the mask signal need not reflect all of the fail information, so that the method for generating the mask signal can be freely changed according to the setting of the disable register 550.

Figure 9:
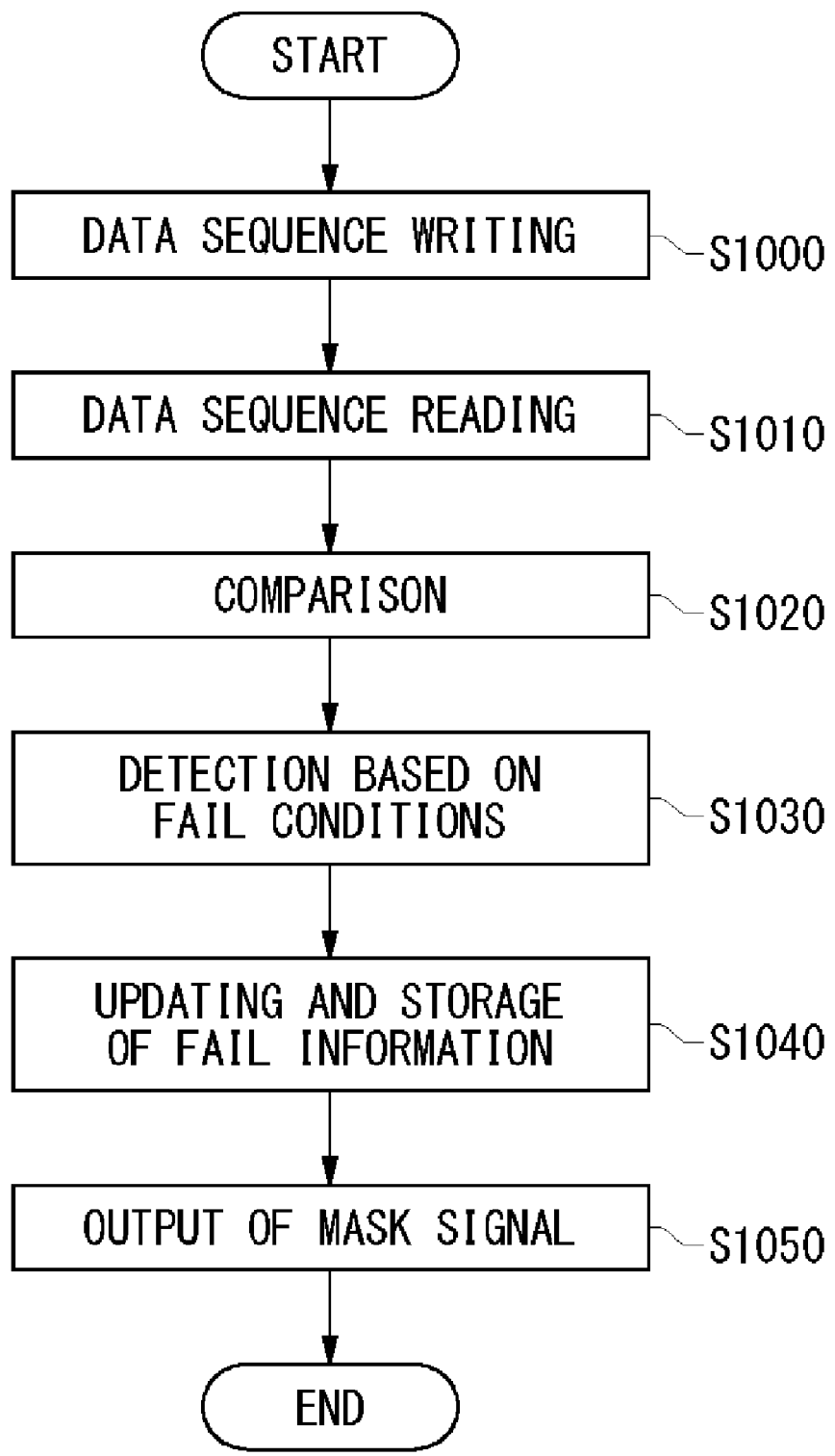
FIG. 9 shows an exemplary process flow for testing the memory under test 100 using the test apparatus 10 according to an embodiment of the present invention.

FIG. 9 shows an exemplary process flow for testing the memory under test 100 using the test apparatus 10 according to an embodiment of the present invention. The waveform shaper 140 writes a test data sequence to a page under test of the memory under test 100 (S1000). The comparator 160 reads the test data sequence written to the page under test (S1010). The comparing section 170 compares the read data sequence to the written data sequence (S1020). The fail detecting section 520 detects whether there are defects corresponding to a plurality of fail conditions (S1030). The updating section 530 accesses the bad block memory 500 and updates the pieces of fail information associated with the block containing the page under test using a fail signal corresponding to allocated fail conditions (S1040). When a prescribed condition is met, the mask processing section 570 outputs a mask signal that cancels further testing of the block (S1050). The mask signal is based on disable information set in the disable register 550. More specifically, the mask processing section 570 reads a plurality of pieces of fail information from the bad block memory 500 and outputs a mask signal if a piece of fail information designated by the disable register 550, from among the read pieces of fail information, indicates that there is a defect in the block.

Figure 10:
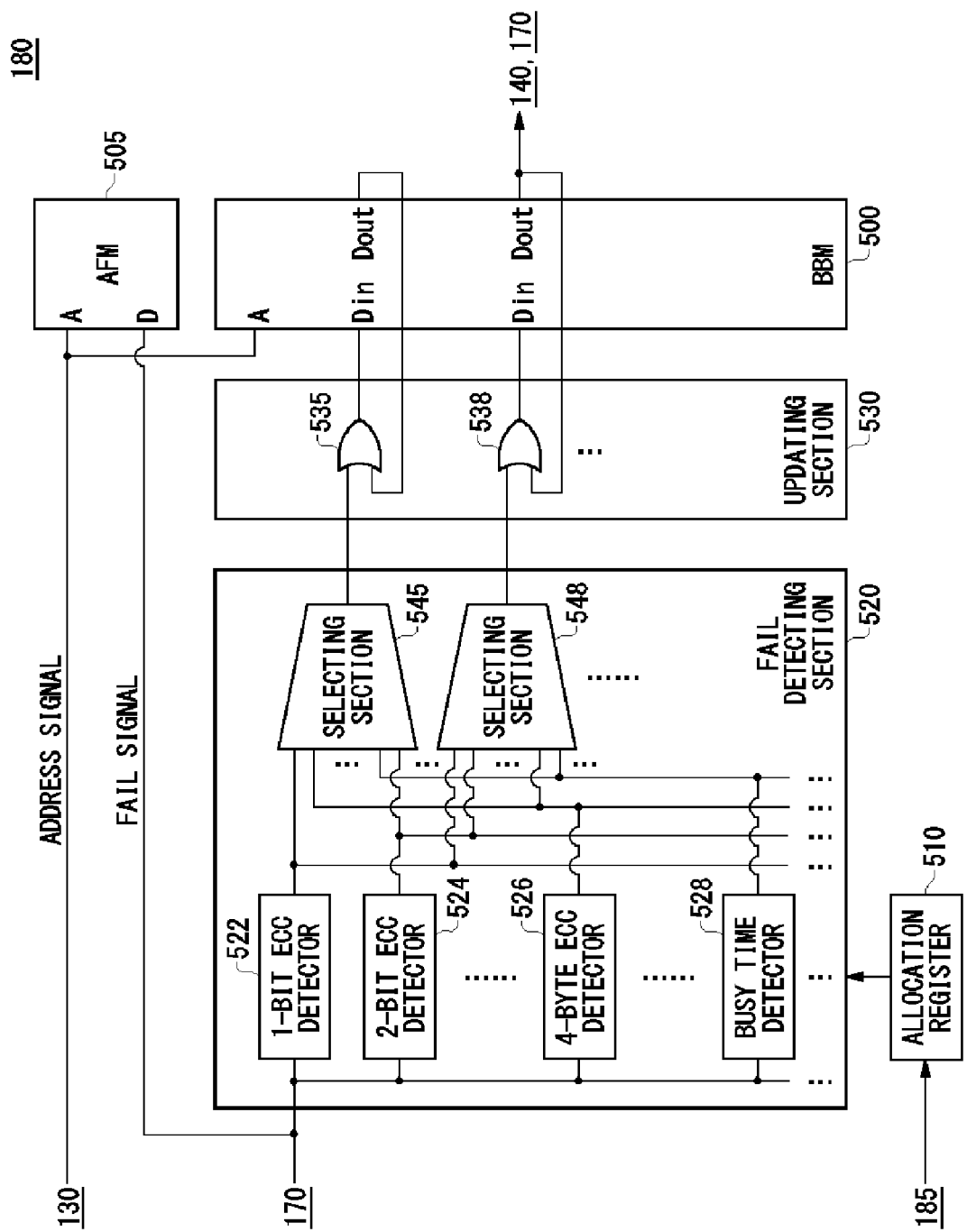
FIG. 10 shows a first modification of the fail managing module 180 according to an embodiment of the present invention.

FIG. 10 shows a first modification of the fail managing module 180 according to an embodiment of the present invention. This modification seeks to simplify the circuit configuration of the fail managing module 180 by fixing the condition for outputting a mask signal while allowing the fail conditions stored as the fail information to be set as desired. The fail managing module 180 of the present modification differs from the fail managing module 180 of FIG. 5 in that the fail managing module 180 of the present modification need not include the mask processing section 570. Furthermore, the fail managing module 180 of the present modification need not include the disable register 550 that controls the mask processing section 570. The remaining configuration of the fail managing module 180 of the present modification may be substantially the same as that of the fail managing module 180 shown in FIG. 5, and therefore further description is omitted. In the fail managing module 180 of the present modification, the fail information read from the bad block memory 500 is output to the waveform shaper 140 and the comparing section 170 as the mask signal to stop each type of process performed by the waveform shaper 140 and the comparing section 170. In this way, the fail managing module 180 adopts a simpler configuration while maintaining one of the benefits of the above embodiment, namely efficient use of the bad block memory 500.

Figure 11:
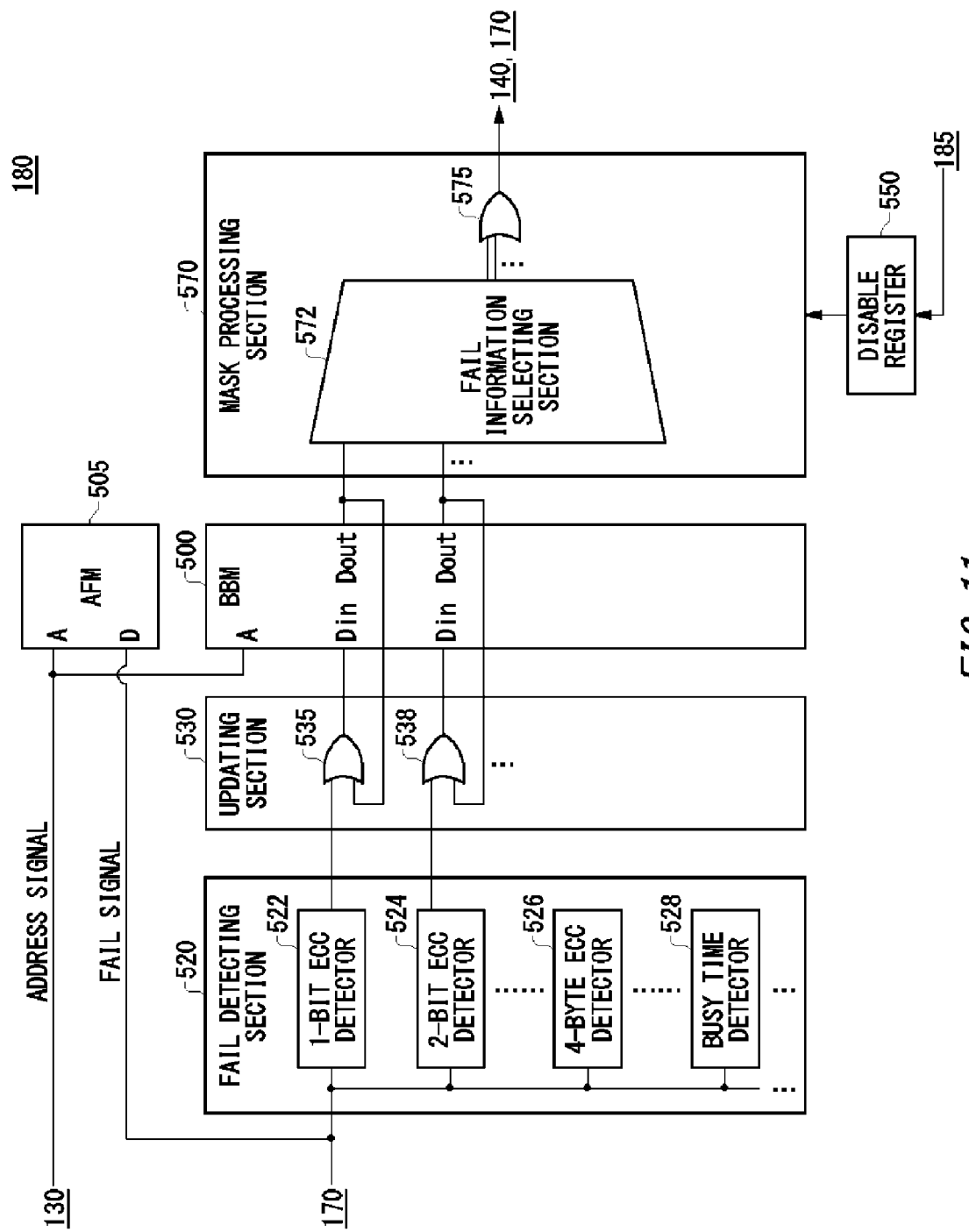
FIG. 11 shows a second modification of the fail managing module 180 according to an embodiment of the present invention.

FIG. 11 shows a second modification of the fail managing module 180 according to an embodiment of the present invention. In contrast to the first modification, this modification seeks to simplify the circuit configuration of the fail managing module 180 by fixing the fail conditions while allowing the condition for outputting the mask signal to be set as desired. The fail managing module 180 of the present modification differs from the fail managing module 180 shown in FIG. 5 in that the fail managing module 180 of the present modification need not include the selecting sections. Furthermore, the fail managing module 180 of the present modification need not include the allocation register 510 that controls the selecting sections. The remaining configuration of the fail managing module 180 of the present modification may be substantially the same as that of the fail managing module 180 shown in FIG. 5, and therefore further description is omitted. In the fail managing module 180 of the present modification, the bad block memory 500 stores, for each block, fail information output from all of the fail detectors in the fail detecting section 520. The mask processing section 570 generates the mask signal based on a combination of pieces of the stored fail information according to a designation from the disable register 550, and outputs the generated mask signal. In this way, the fail managing module 180 adopts a simpler configuration while maintaining one of the benefits of the above embodiment, namely a high degree of freedom for settings of the mask signal.

While the embodiments of the present invention have been described, the technical scope of the invention is not limited to the above described embodiments. It is apparent to persons skilled in the art that various alterations and improvements can be added to the above-described embodiments. For example, in the above embodiments and modifications, the fail information is information to be stored in the bad block memory 500 and each piece is 1-bit data allocated to correspond to a selecting section, but the fail information may instead be grouped in pieces of data of 2 bits or more depending on the objective of the test. Furthermore, the fail information is not limited to a logical sum of a plurality of detection results from fail detectors, and may instead be a result obtained by performing any of a variety of logical computations on a plurality of logic values indicating detection results. In the above embodiments and modifications, the fail information stored in the bad block memory 500 is overwritten with the same fail information, but is not updated with other fail information. Instead, when the fail information indicates the number of errors or the like, the updating section 530 may increment the number indicated by the stored fail information in response to input of a new fail signal, and overwrite the incremented number over the previously stored number. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a memory under test accessed in page-units and having a storage region that can be disabled in block-units that contain defects, each block including a plurality of pages, the test apparatus comprising:
   a bad block memory that stores a plurality of pieces of fail information in association with the blocks of the memory under test, each piece of fail information indicating whether there is a defect in the corresponding block;
   a data writing section that writes a test data sequence to a page under test of the memory under test;
   a data reading section that reads the test data sequence written to the page under test;
   a comparing section that compares the read data sequence to the written data sequence;
   a fail detecting section that detects whether there is a defect corresponding to each of a plurality of predetermined fail conditions serving as conditions for determining whether there is a defect in the page under test, and outputs the detection result as a fail signal; and
   an updating section that updates a plurality of pieces of fail information associated with the block including the page under test using the fail signal corresponding to fail conditions allocated in advance to the plurality of pieces of fail information associated with the block including the page under test.

2. The test apparatus according to claim 1, further comprising an allocation register that stores allocation information for setting which of the plurality of fail conditions for judging whether there is a defect in the page under test are allocated to the plurality of pieces of fail information, wherein
   the updating section updates the plurality of pieces of fail information associated with the block including the page under test using the fail signal corresponding to fail conditions allocated according to the allocation information.

3. The test apparatus according to claim 2, wherein
   the fail detecting section includes:
   a plurality of fail detectors that detect different defects in the page under test based on at least one of (i) the comparison result of the comparing section, (ii) time needed to write the data sequence, and (iii) time needed to read the data sequence; and
   a plurality of selecting sections that (i) are provided to correspond respectively to the plurality of pieces of fail information, (ii) each select a fail detector to which the corresponding fail information is allocated, based on the allocation register, and (iii) each output a fail signal generated based on a detection result from the selected fail detector, wherein
the updating section updates the plurality of pieces of fail information associated with the block including the page under test using the plurality of fail signals output by the plurality of selecting sections.

4. The test apparatus according to claim 1, further comprising:
a disable register that stores disable information designating, from among the plurality of pieces of fail information, pieces of fail information associated with a defect for which the block is to be disabled;
a mask processing section that reads, from the bad block memory, the plurality of pieces of fail information associated with the block including the page under test, and that cancels testing of the page under test if the pieces of fail information designated by the disable register from among the plurality of pieces of read fail information indicate that there is a defect in the block.

5. The test apparatus according to claim 4, wherein the mask processing section includes:
a fail information selecting section that selects the pieces of fail information designated by the disable register from among the plurality of pieces of read fail information; and
a mask generating section that generates a mask signal indicating whether to cancel testing of the page under test, based on the selected pieces of fail information, wherein
when the mask signal indicating cancellation of testing of the page under test is received, the data writing section cancels writing of the test data sequence to this page.

6. The test apparatus according to claim 4, wherein the mask processing section includes:
a fail information selecting section that selects the pieces of fail information designated by the disable register from among the plurality of pieces of read fail information; and
a mask generating section that generates a mask signal indicating whether to cancel testing of the page under test, based on the selected pieces of fail information, wherein
when the mask signal indicating cancellation of testing of the page under test is received, the comparing section does not detect a discrepancy between the data sequence read from this page and the data sequence written to this page.

7. A test apparatus for testing a memory under test accessed in page-units and having a storage region that can be disabled in block-units that contain defects, each block including a plurality of pages, the test apparatus comprising:
a bad block memory that stores a plurality of pieces of fail information in association with the blocks of the memory under test, each piece of fail information indicating whether there is a defect in the corresponding block;
a data writing section that writes a test data sequence to a page under test of the memory under test;
a data reading section that reads the test data sequence written to the page under test;
a comparing section that compares the read data sequence to the written data sequence;
a fail detecting section that detects whether there is a defect corresponding to a plurality of fail conditions for determining whether there is a defect in the page under test, and outputs the detection results as fail signals;
an updating section that updates a plurality of pieces of fail information associated with the block including the page under test using a plurality of the fail signals;
a disable register that stores disable information designating, from among the plurality of pieces of fail information, pieces of fail information associated with a defect for which the block is to be disabled; and
a mask processing section that reads, from the bad block memory, the plurality of pieces of fail information associated with the block including the page under test, and that cancels testing of the page under test if the pieces of fail information designated by the disable register from among the plurality of pieces of read fail information indicate that there is a defect in the block.

8. A method for testing, with a test apparatus, a memory under test accessed in page-units and having a storage region that can be disabled in block-units that contain defects, each block including a plurality of pages, the method comprising:
causing a bad block memory provided to the test apparatus to store a plurality of pieces of fail information in association with the blocks of the memory under test, each piece of fail information indicating whether there is a defect in the corresponding block;
writing a test data sequence to a page under test of the memory under test;
reading the test data sequence written to the page under test;
comparing the read data sequence to the written data sequence;
detecting whether there is a defect corresponding to each of a plurality of predetermined fail conditions serving as conditions for determining whether there is a defect in the page under test, and outputting the detection result as a fail signal; and
updating a plurality of pieces of fail information associated with the block including the page under test using the fail signal corresponding to fail conditions allocated in advance to the plurality of pieces of fail information associated with the block including the page under test.

9. A method for testing, with a test apparatus, a memory under test accessed in page-units and having a storage region that can be disabled in block-units that contain defects, each block including a plurality of pages, the method comprising:
storing, in a bad block memory provided to the test apparatus, a plurality of pieces of fail information in association with the blocks of the memory under test, each piece of fail information indicating whether there is a defect in the corresponding block;
writing a test data sequence to a page under test of the memory under test;
reading the test data sequence written to the page under test;
comparing the read data sequence to the written data sequence;
detecting whether there is a defect corresponding to a plurality of fail conditions for determining whether there is a defect in the page under test, and outputting the detection results as fail signals;
updating a plurality of pieces of fail information associated with the block including the page under test using a plurality of the fail signals;
storing, in a disable register provided to the test apparatus, disable information designating, from among the plurality of pieces of fail information, pieces of fail information associated with a defect for which the block is to be disabled;

prior to writing the test data sequence to the page under test, reading, from the bad block memory, the plurality of pieces of fail information associated with the block including the page under test; and canceling testing of the page under test if the pieces of fail information designated by the disable register from among the plurality of pieces of read fail information indicate that there is a defect in the block.

10. A test apparatus that tests a memory under test, which is a flash memory including a plurality of blocks that each include a plurality of pages, the test apparatus comprising:

a fail detecting section that detects a defect in (i) reading or writing of page-units of data from or to the memory under test or (ii) a process for deleting a block-unit of data from the memory under test, and outputs the detection result as a fail signal;

a control apparatus that divides the memory under test into a plurality of grades based on the fail signal output by the fail detecting section, wherein the fail detecting section includes a fail detector detecting at least one of (i) whether error correction is possible with any of a plurality of different types of error correction codes, (ii) whether or not a program time, which is a time needed from when the writing begins to complete the writing, is greater than or equal to a reference value and (iii) whether or not a time needed to delete a block-unit of data is greater than or equal to a reference value.

11. The test apparatus according to claim 10, further comprising a mask processing section that cancels testing of a block on a condition that the block is indicated as being a defective block based on the fail signal output by the fail detecting section.

* * * * *